(12) United States Patent
Huang et al.

(10) Patent No.: US 11,929,749 B2
(45) Date of Patent: *Mar. 12, 2024

(54) METHODS AND APPARATUSES FOR TEMPERATURE INDEPENDENT DELAY CIRCUITRY

(71) Applicant: MICRON TECHNOLOGY, INC., Boise, ID (US)

(72) Inventors: Zhiqi Huang, Shanghai (CN); Weilu Chu, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/813,291

(22) Filed: Jul. 18, 2022

(65) Prior Publication Data

US 2022/0352882 A1 Nov. 3, 2022

Related U.S. Application Data

(63) Continuation of application No. 16/472,773, filed as application No. PCT/CN2018/110623 on Oct. 17, 2018, now Pat. No. 11,398,815.

(51) Int. Cl.
*H03K 5/134* (2014.01)
*G11C 11/4076* (2006.01)
*G11C 11/4093* (2006.01)

(52) U.S. Cl.
CPC .......... *H03K 5/134* (2014.07); *G11C 11/4076* (2013.01); *G11C 11/4093* (2013.01)

(58) Field of Classification Search
CPC ........................... H03K 5/134; G11C 11/4076
See application file for complete search history.

(56) References Cited

U.S. PATENT DOCUMENTS 6,580,287 B2    6/2003  Hsu et al.
6,621,762 B1    9/2003  Roohparvar
(Continued)

FOREIGN PATENT DOCUMENTS

CN    1210393 A    3/1999
CN    1296665 A    5/2001
(Continued)

OTHER PUBLICATIONS

International Search Report and Written Opinion dated Jul. 23, 2019 for PCT Application No. PCT/CN2018/110623, 9 pages.

*Primary Examiner* — Cassandra F Cox
(74) *Attorney, Agent, or Firm* — Dorsey & Whitney LLP

(57) ABSTRACT

Methods and apparatuses are provided for temperature independent resistive-capacitive delay circuits of a semiconductor device. For example, delays associated with ZQ calibration or timing of the RAS chain may be implemented that to include circuitry that exhibits both proportional to absolute temperature (PTAT) characteristics and complementary to absolute temperature (CTAT) characteristics in order to control delay times across a range of operating temperatures. The RC delay circuits may include a first type of circuitry having impedance with PTAT characteristics that is coupled to an output node in parallel with a second type of circuitry having impedance with CTAT characteristics. The first type of circuitry may include a resistor and the second type of circuitry may include a transistor, in some embodiments.

19 Claims, 5 Drawing Sheets

(56) References Cited

U.S. PATENT DOCUMENTS

| | | |
|---|---|---|
| 6,812,760 B1 | 11/2004 | Kim et al. |
| 7,471,130 B2 | 12/2008 | Gomm et al. |
| 7,557,631 B2 | 7/2009 | Sinha et al. |
| 7,772,908 B2 * | 8/2010 | Sinha .................... G11C 11/406 |
| | | 327/261 |
| 9,300,276 B2 * | 3/2016 | Tung .................... H03K 3/0315 |
| 10,878,862 B2 | 12/2020 | Joo et al. |
| 11,257,529 B2 | 2/2022 | Joo et al. |
| 11,398,815 B2 * | 7/2022 | Huang .................... G11C 7/00 |
| 2003/0107936 A1 | 6/2003 | Jung et al. |
| 2003/0193360 A1 | 10/2003 | Lee et al. |
| 2005/0135430 A1 | 6/2005 | Le et al. |
| 2005/0237848 A1 | 10/2005 | Takahashi et al. |
| 2006/0261869 A1 | 11/2006 | Gomm et al. |
| 2009/0168555 A1 | 7/2009 | Lee |
| 2012/0033503 A1 | 2/2012 | Kim et al. |
| 2013/0093522 A1 | 4/2013 | Pedersen et al. |
| 2015/0116882 A1 | 4/2015 | Bowers |
| 2020/0090713 A1 | 3/2020 | Joo et al. |
| 2021/0074341 A1 | 3/2021 | Joo et al. |
| 2021/0184667 A1 | 6/2021 | Hayashi et al. |

FOREIGN PATENT DOCUMENTS

| | | |
|---|---|---|
| CN | 1574084 A | 2/2005 |
| CN | 101026006 A | 8/2007 |
| WO | 2020077558 A1 | 4/2020 |

\* cited by examiner

METHODS AND APPARATUSES FOR TEMPERATURE INDEPENDENT DELAY CIRCUITRY

CROSS-REFERENCE TO RELATED APPLICATION

This application is a continuation of U.S. patent application Ser. No. 16/472,773, filed Jun. 21, 2019, issued as U.S. Pat. No. 11,398,815 on Jul. 26, 2022, which is a 35 U.S.C. § 371 National Stage Application of PCT Application No. PCT/CN2018/110623, filed Oct. 17, 2018. These applications and patent are incorporated by reference herein in their entirety and for all purposes.

BACKGROUND

High data reliability, high speed of memory access, and reduced chip size are features that are demanded from semiconductor memory. In recent years, there has been an effort to further increase the speed of memory access. In the pursuit of higher speeds, collateral issues related to timing arise due to decreased timing margins. Specifically, changes in a delay circuitry during operation may affect performance of memory devices. For example, physical characteristics of device circuitry may change across a temperature range. Some delay circuitry may have different delay characteristic at lower temperatures as compared with delay characteristics at higher temperatures. Improvement of delay consistency across temperatures may improve device reliability.

DETAILED DESCRIPTION OF VARIOUS EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
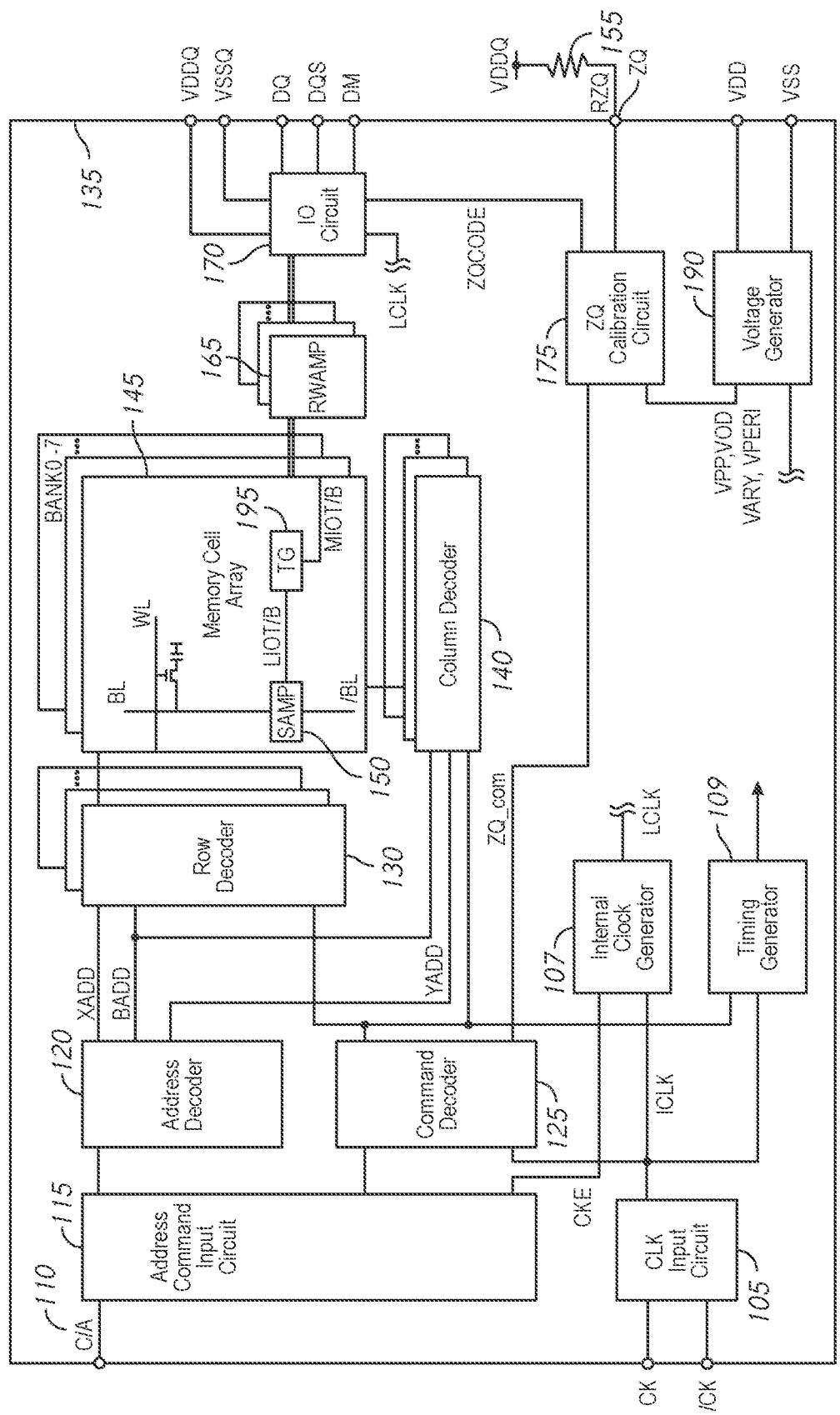
FIG. 1 is a schematic block diagram of a semiconductor memory device, in accordance with an embodiment of the present disclosure.

FIG. 1 is a schematic block diagram of a semiconductor memory device 100, in accordance with an embodiment of the present disclosure. For example, the semiconductor memory device 100 may include a chip 135 and a ZQ resistor (RZQ) 155. The chip 135 may include a clock input circuit 105, an internal clock generator 107, a timing generator 109, an address command input circuit 115, an address decoder 120, a command decoder 125, a plurality of row decoders 130, a memory cell array 145 including sense amplifiers 150 and transfer gates 195, a plurality of column decoders 140, a plurality of read/write amplifiers 165, an input/output (I/O) circuit 170, a ZQ calibration circuit 175, and a voltage generator 190. The semiconductor memory device 100 may include a plurality of external terminals including address and command terminals coupled to command/address bus 110, clock terminals CK and /CK, data terminals DQ, DQS, and DM, power supply terminals VDD, VSS, VDDQ, and VSSQ, and a calibration terminal ZQ. The chip 135 may be mounted on a substrate, for example, a memory module substrate, a mother board or the like.

The memory cell array 145 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide or generate various internal command signals. For example, the internal command signals may include a row command signal to select a word line, a column command signal, such as a read command or a write command, to select a bit line, and a ZQ calibration command that may activate the ZQ calibration circuit 175.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170 and the ZQ calibration circuit 175.

The calibration terminal ZQ of the semiconductor memory device 100 may be coupled to the ZQ calibration circuit 175. The ZQ calibration circuit 175 may perform a calibration operation with reference to an impedance of the ZQ resistor (RZQ) 155. In some examples, the ZQ resistor (RZQ) 155 may be mounted on a substrate that is coupled to the calibration terminal ZQ. For example, the ZQ resistor (RZQ) 155 may be coupled to a power supply voltage (VDDQ). An impedance code ZQCODE obtained by the calibration operation may be provided to the IO circuit 170, and thus an impedance of an output buffer (not shown) included in the IO circuit 170 is specified. In some examples, the ZQ calibration circuit 175 may include an oscillator that is used to provide clock cycles to facilitate counting of delay timing during the calibration process. In some examples, the oscillator may include resistive-capacitive (RC) delay circuits that are designed to provide delay characteristics that are constant over a wide temperature range. For example, the RC delay circuits may include circuitry that includes both proportional to absolute temperature (PTAT) circuitry and complementary to absolute temperature (CTAT) circuitry. In combination, the PTAT and CTAT circuitry may stabilize a delay over a wide temperature range. The temperature-independent delay may provide a more reliable and accurate ZQ calibration as compared with RC delay circuits that only employ one of PTAT or CTAT circuitry. In other examples, other circuitry of the semiconductor device 100 may implement the RC delay circuits to provide specific delays characteristics across a large temperature range, such as circuitry associated with the row address strobe (RAS) chain circuitry, which may include one or more of the address decoder 120, the command decoder 125, the row decoder 130, and circuitry of the memory cell array 145. For example, the RC delay circuits may be designed to exhibit PTAT characteristics, CTAT characteristics, or temperature independence (e.g., constant delay characteristics across a wide temperature range. The RC delay circuits may be designed to adjust a strength of the PTAT and/or CTAT characteristics. Implementing temperature independent RC delay devices or RC delay devices with particular temperature dependencies may improve timing reliability within the semiconductor device 100 as compared with delay circuits that exhibit only PTAT or CTAT characteristics.

Figure 2:
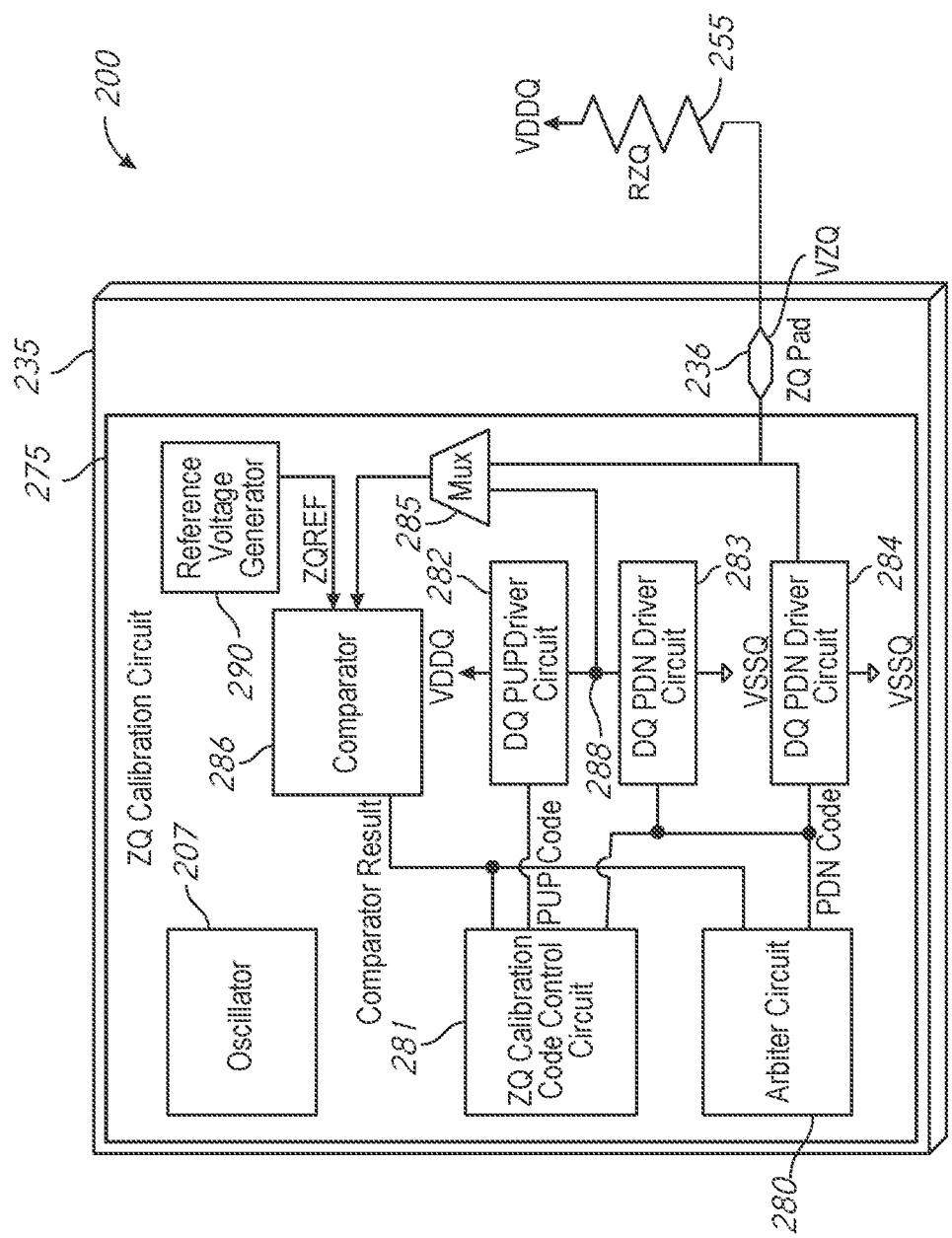
FIG. 2 is a circuit diagram of a ZQ calibration circuit in accordance with an embodiment of the present disclosure.

FIG. 2 is a circuit diagram of a ZQ calibration circuit 275 in accordance with an embodiment of the present disclosure. For example, the chip 235 includes the ZQ calibration circuit 275 and a calibration terminal ZQ (e.g., ZQ pad) 236. In some examples, the ZQ calibration circuit 275 may include an arbiter circuit 280 that controls initiation of a calibration operation when multiple chips are coupled to the ZQ resistor RZQ 255.

The arbiter circuit 280 may be activated responsive to an activation of a chip (e.g., power on, etc.), and may provide a pull-down (PDN) code signal when activated. The ZQ calibration circuit 275 may include a combination of a data terminal (DQ) pull-up (PUP) driver circuit 282 and a data terminal (DQ) pull-down (PDN) driver circuit 283 and a data terminal (DQ) pull-down (PDN) driver circuit 284 for arbitration as well as calibration. The DQ PUP driver circuit 282, DQ PDN driver circuit 283, and DQ PDN driver circuit 284 are replica circuits of a data terminal (DQ) pull-up (PUP) driver circuit, a data terminal (DQ) pull-down (PDN) driver circuit and a data terminal (DQ) pull-down (PDN) driver circuit attached to actual data terminals DQ. The DQ PDN driver circuit 284 may receive the PDN code signal from the arbiter circuit 280, and may pull down a ZQ pad voltage (VZQ) at the calibration terminal ZQ 236 responsive to the PDN code signal.

The ZQ pad voltage (VZQ) may be provided to a switch 285 (e.g., multiplexer Mux). The combination of the DQ PUP driver circuit 282 and the DQ PDN driver circuit 283 may execute adjustment of an intermediate ZQ voltage (iVZQ) at an intermediate node 288 between the combination of the DQ PUP driver circuit 282 and the DQ PDN driver circuit 283. For example, the DQ PUP driver circuit 282 may include a plurality of transistors coupled in parallel between a power supply terminal VDDQ and the intermediate node 288. The DQ PDN driver circuit 283 may include a plurality of transistors coupled in parallel between a power supply terminal VSSQ and the intermediate node 288. The intermediate ZQ voltage (iVZQ) may be provided to the switch 285. The switch 285 may provide either the ZQ pad voltage VZQ or the intermediate ZQ voltage iVZQ, depending on whether the ZQ calibration circuit 275 is executing arbitration or ZQ calibration, respectively. For example, the ZQ calibration circuit 275 may include a comparator 286.

The comparator 286 may compare the ZQ pad voltage VZQ or the intermediate ZQ voltage iVZQ provided by the switch 285 with a ZQ reference voltage ZQVREF or a ZQ arbitration reference voltage provided by a reference voltage generator 290. For example, the reference voltage generator 290 may be included in the ZQ calibration circuit 275, or the voltage generator 290 in FIG. 2 may provide the ZQ reference voltage ZQVREF and the ZQ arbitration reference voltage instead. For example, the comparator 286 may determine whether the ZQ pad voltage (VZQ) has been controlled by another requesting chip or the ZQ resistor RZQ 255 is currently in use.

The comparator 286 may provide a comparator result signal to the arbiter circuit 280 and a ZQ calibration code control circuit 281. For example, the arbiter circuit 280 may provide ZQ pad voltage control via the DQ PDN driver circuit 284 according to a ZQ timing pattern unique to the chip, having a fixed duration common to the plurality of chips. The arbiter circuit 280 may provide the PDN code until the ZQ pad voltage (VZQ) at the calibration terminal ZQ 236 matches the ZQ reference voltage ZQVREF. The ZQ timing pattern is unique for each chip, in order to determine whether the requesting chip should gain access to a ZQ resistor RZQ 255. The ZQ timing pattern may be programmed, or otherwise stored for each chip. For example, the arbiter circuit 280 for the chip 235 may include a register (not shown) for the chip 235 that may be programmed with the ZQ timing pattern information specific to the chip 235 for an assigned duration. The arbiter circuit 280 may interface with the oscillator 207 in order to provide the ZQ voltage control signals in accordance with the ZQ timing pattern. That is, the oscillator 207 may provide a clock signal used by the arbiter circuit 280 to align ZQ voltage control with the specific ZQ timing pattern. Because of high speed clock signals, variance in signal timing by the arbiter circuit 280 may result in unreliable operation of a semiconductor device. The oscillator 207 may include RC delay circuitry configured to provide the clock signal for the arbiter circuit 280 that is temperature independent. For example, the oscillator 207 may include RC delay circuitry that combines PTAT and CTAT characteristics to cancel out temperature variance to provide a clock signal with consistent timing characteristics across a range of operating temperatures. The RC delay circuitry may include one or more delay elements that each include CTAT and PTAT circuitry, in some examples. Designing the oscillator 207 to exhibit temperature independent timing characteristics may improve reliability and accuracy of the ZQ voltage control provided by the arbiter circuit 280.

The ZQ calibration code control circuit 281 provides a PUP code and a PDN code to the DQ PUP driver circuit 282 and the DQ PDN driver circuit 283 respectively, responsive to the comparator result signal. In some examples, the PUP code and a PDN code are provided until the intermediate ZQ voltage iVZQ at the intermediate node 288 match the ZQ reference voltage ZQVREF. The PUP code and the PDN code may be included in the ZQCODE of FIG. 1.

Figure 3:
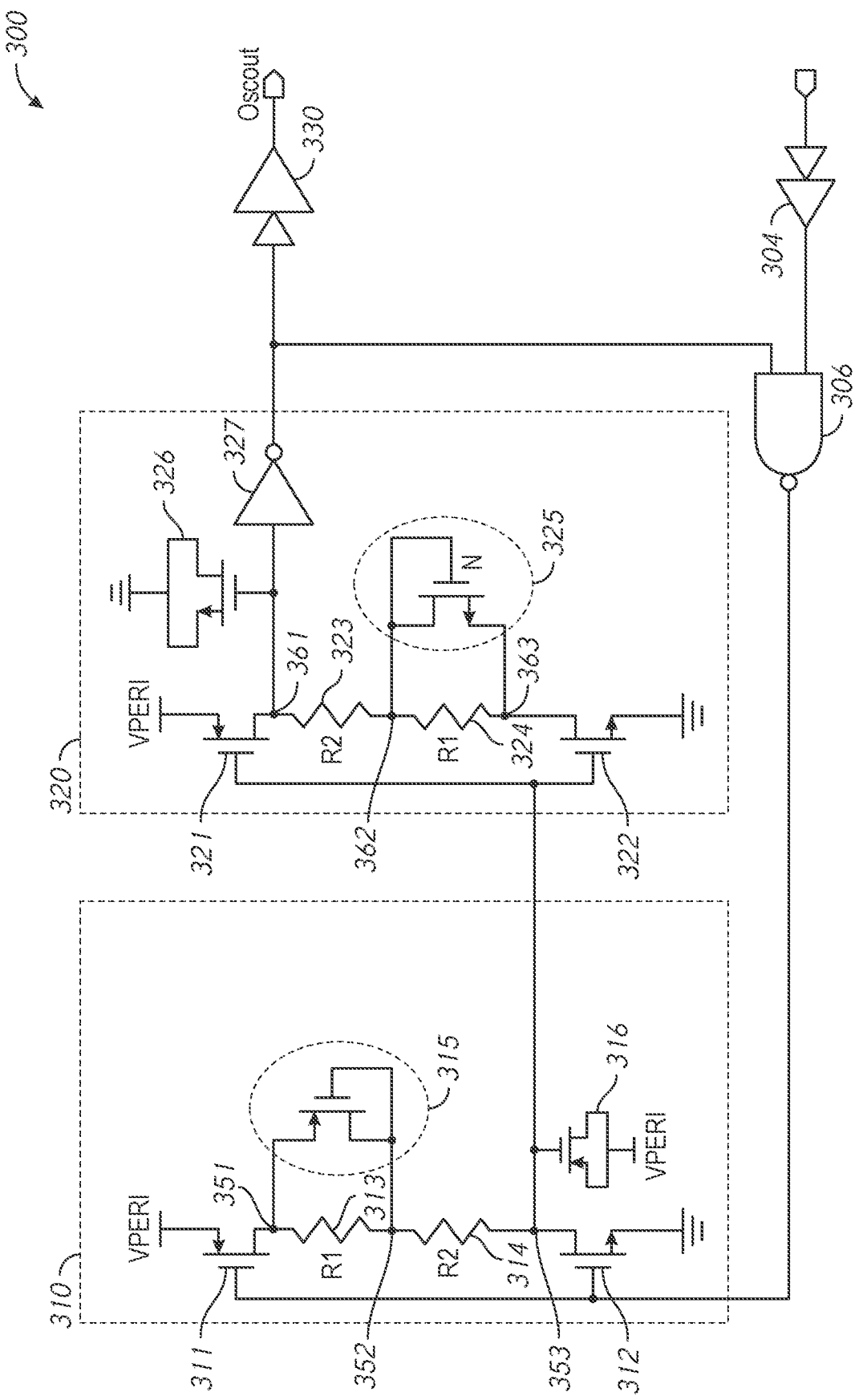
FIG. 3 is a circuit diagram of an oscillator circuit in accordance with an embodiment of the present disclosure.

FIG. 3 is a circuit diagram of an oscillator circuit 300 in accordance with an embodiment of the present disclosure. The oscillator 207 of FIG. 2 may implement the oscillator circuit 300. The oscillator circuit 300 may include a delay element 310 coupled to a delay element 320. The delay element 310 may receive an input signal via a NAND gate 306. The delay element 320 may provide an oscillator output signal OSCOUT via an output driver circuit 330. The input signal provided by the NAND gate 306 may be based on the output of the delay element 320 and also on an enable signal EN.

The delay element 310 may include an inverter formed via a pair of serially coupled transistors 311 and 312. The gates of the transistors 311 and 312 may each be coupled to the output of the NAND gate 306. The delay element 310 may further include a pair of serially-coupled resistors 313 (e.g., first circuitry or first circuit component) and 314 (e.g., third circuitry or third circuit component) coupled between nodes 351 and 353 and having resistances R1 and R2, respectively. The delay element 310 further includes a transistor 315 (e.g., second circuitry or second circuit component) coupled in parallel with the resistor 313 between the nodes 351 and 352, with a gate of the transistor 315 coupled to the node 352. A capacitor 316 having a capacitance C is coupled to the node 353. Relative sizes of the resistors 313 and 314 may be selected to provide a particular RC delay. In some examples, impedance of the resistors 313 and 314 may exhibit PTAT characteristics (e.g., the RC delay is shorter at lower temperatures and longer at higher temperature). To counteract the PTAT behavior, the transistor 315 may be coupled in parallel with the resistor 313. The impedance of the transistor 315 may be 1/gm, where gm is the conductance of the transistor 315. Thus, the impedance of the transistor 315 has CTAT characteristics. The size of the transistor 315 may be adjusted to adjust the gm value.

The total delay for the delay element 310 may be defined as:

$$Tdelay = (1/gm \| R1 + R2) * C$$

The R1 and R2 values of the resistors 313 and 314, respectively, and the size of the transistor 315 may be adjusted to set a specific delay for the delay element 310. Thus, the delay element 310 may be designed to exhibit a specific delay characteristic, such as constant RC delay, some PTAT characteristic RC delay, or some CTAT characteristic delay.

Similar to the delay element 310, the delay element 320 may include an inverter formed via a pair of serially coupled transistors 321 and 322. The gates of the transistors 321 and 322 may each be coupled to the output of the delay element 310. The delay element 320 may further include a pair of serially-coupled resistors 323 (e.g., third circuitry or third circuit component) and 324 (e.g., first circuitry or first circuit component) coupled between nodes 361 and 363 and having resistances R2 and R1, respectively. The delay element 320 further includes a transistor 325 (e.g., second circuitry or second circuit component) coupled in parallel with the resistor 323 between the nodes 362 and 363, with a gate of the transistor 325 coupled to the node 362. A 326 having a capacitance C is coupled to the node 361. Relative sizes of the resistors 323 and 324 may be selected to provide a particular RC delay. In some examples, impedance of the resistors 323 and 324 may exhibit PTAT characteristics (e.g., the RC delay is shorter at lower temperatures and longer at higher temperature). To counteract the PTAT behavior, the transistor 325 may be coupled in parallel with the resistor 324. The impedance of the transistor 325 may be 1/gm, where gm is the conductance of the transistor 325. Thus, the impedance of the transistor 325 has CTAT characteristics. The size of the transistor 325 may be adjusted to adjust the gm value.

The total delay for the delay element 320 may be defined as:

$$Tdelay = (1/gm \| R1 + R2) * C$$

The R1 and R2 values of the resistors 323 and 324, respectively, and the size of the transistor 325 may be adjusted to set a specific delay for the delay element 320. Thus, the delay element 320 may be designed to exhibit a specific delay characteristic, such as constant RC delay, some PTAT characteristic RC delay, or some CTAT characteristic delay. The node 361 may be coupled to an inverter 327, which provides an inverted output signal to the NAND gate 306 and to the output driver circuit 330. The output driver circuit 330 may drive the OscOut signal based on the output of the inverter 327.

In operation, the oscillator circuit 300 may be enabled via the EN signal provided via an input driver circuit 304 to the NAND gate 306. The EN signal may be based on a ZQ calibration and arbitration operations. The oscillator 300 may provide the OscOut signal as a clock signal used for timing-based operations related to the ZQ calibration and arbitration operations. The OscOut signal provided by the oscillator circuit 300 may be implemented in other timing-based operations or applications. In response to the EN signal, the oscillator circuit 300 may propagate the output of the NAND gate 306 through the delay element 310 and the delay element 320 with timing based on an RC delay. Thus, the delay through the delay element 310 may be based on the R1 and R2 resistance values, the gm of the transistor 315, and the C of the capacitor 316. Similarly, the delay through the delay element 320 may be based on the R1 and R2 resistance values, the gm of the transistor 325, and the C of the 326. In some examples, the R1 and R2 resistance values and the gm values for each of the delay element 310 and the delay element 320 may be equal such that the RC delay for each of the delay element 310 and the delay element 320 are equal. In some examples, the R1 and R2 resistance values and the gm values for each of the delay element 310 and the delay element 320 may be designed to provide a temperature-independent RC delay, where temperature-based differences of the PTAT characteristic circuitry (e.g., the resistors 313 and 314 of the delay element 310 and the resistors 323 and 324 of the delay element 320) are counter-balanced by temperature-based differences of the CTAT characteristic circuitry (e.g., the transistor 315 of the delay element 310 and the transistor 325 of the delay element 320).

The output from the node 361 of the delay element 320 may be provided to the inverter 327. The inverter 327 may be designed to be a fast inverter with a small delay. The output driver circuit 330 may drive the OscOut signal based on the output of the inverter 327, and the NAND gate 306 value may toggle as the output of the inverter 327 toggles while the EN signal enables the oscillator circuit 300 is enabled.

The transistor 315 may be a p-type transistor and the transistor 325 may be an n-type transistor. In some examples, both the delay element 310 and the delay element 320 may be included to provide timing consistency for rising and falling transitions. In other examples, the oscillator circuit 300 may be implemented with only the delay element 310 (e.g., with the node 353 coupled to the output driver circuit 330 and the NAND gate 306) without departing from the scope of the disclosure. In yet other examples, additional delay elements may be added in series with the delay element 310 and the delay element 320 to provide a longer clock cycle on the OscOut signal without departing from the scope of the disclosure. Implementing the transistor 315 and the transistor 325 in parallel with the resistors 313 and 324, respectively, may reduce temperature-based RC delay differences as compared with designs that only include the resistors 313 and 314 and resistors 323 and 324.

Figure 4:
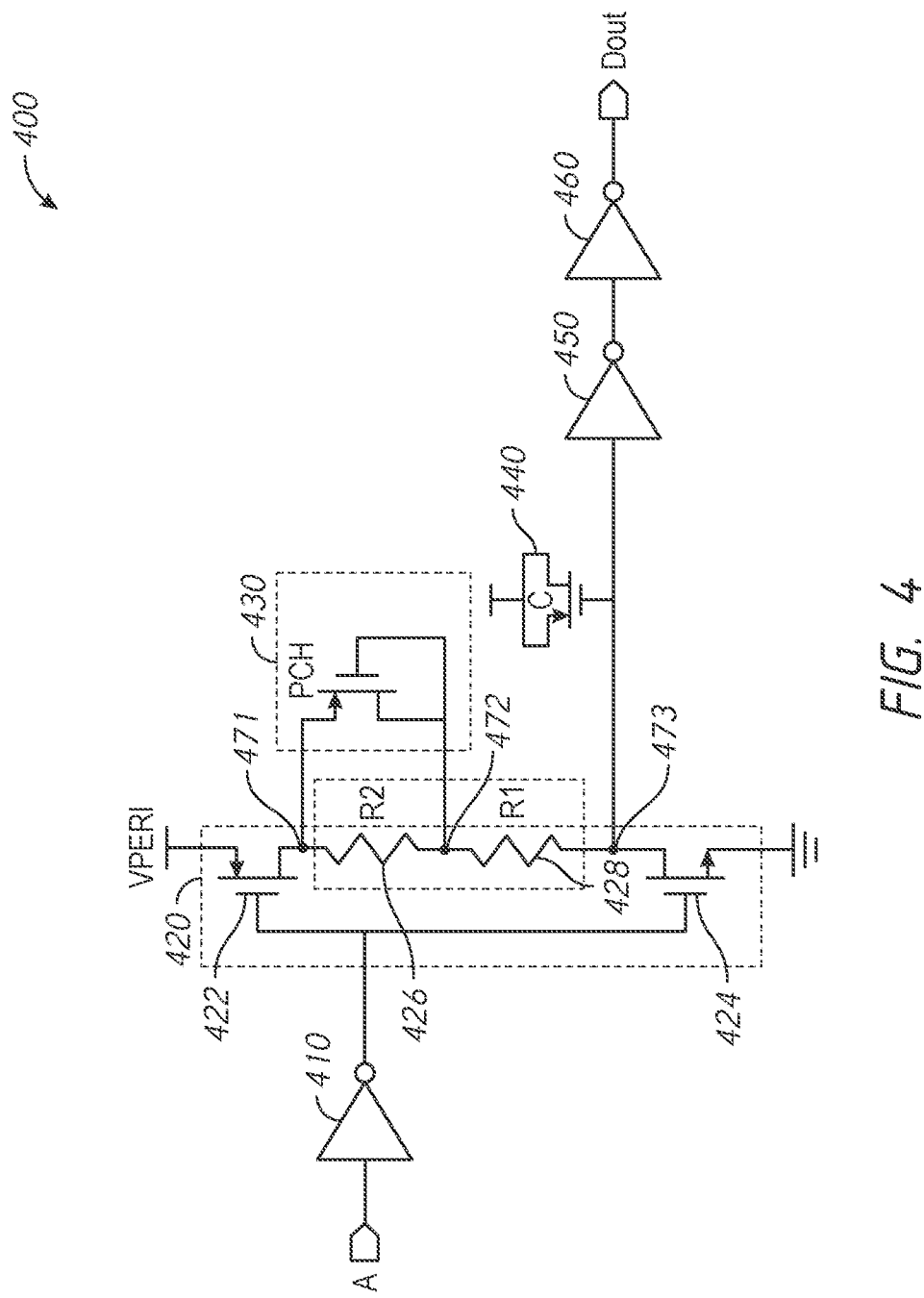
FIG. 4 is a circuit diagram of an RC delay circuit in accordance with an embodiment of the present disclosure.

FIG. 4 is a circuit diagram of an RC delay circuit 400 in accordance with an embodiment of the present disclosure. Circuitry of the RAS timing chain the semiconductor device 100 of FIG. 1 (e.g., the command decoder, the address decoder, the row decoders, memory array circuitry 145, or any combination thereof) may implement the RC delay circuit 400. The RC delay circuit 400 may include an inverter 410 coupled to an inverter 420, which may be coupled to a transistor 430, a capacitor 440, an inverter 450 and an inverter 460. The RC delay circuit 400 may receive an input signal A and provide an output signal Dout.

The inverter 410 may provide an inverter A signal to the inverter 420. The inverter 420 may include a pair of serially coupled transistors 422 and 424. The gates of the transistors 422 and 424 may each be coupled to the output of the inverter 410. The inverter 420 may further include a pair of serially-coupled resistors 426 (e.g., first circuitry or first circuit component) and 428 (e.g., third circuitry or third circuit component) coupled between nodes 471 and 473 and having resistances R1 and R2, respectively. The transistor 430 (e.g., second circuitry or second circuit component) may be coupled in parallel with the resistor 426 between the nodes 471 and 472, with a gate of the transistor 430 coupled to the node 472. A capacitor 440 having a capacitance C is coupled to the node 473. Relative sizes of the resistors 426 and 428 may be selected to provide a particular RC delay. In some examples, impedance of the resistors 426 and 428 may exhibit PTAT characteristics (e.g., the RC delay is shorter at lower temperatures and longer at higher temperature). To counteract the PTAT behavior, the transistor 430 may be coupled in parallel with the resistor 426. The impedance of the transistor 430 may be 1/gm, where gm is the conductance of the transistor 430. Thus, the impedance of the transistor 430 has CTAT characteristics. The size of the transistor 430 may be adjusted to adjust the gm value.

The total delay for the RC delay circuit may be defined as:

$$Tdelay=(1/gm\|R1+R2)*C$$

The R1 and R2 values of the resistors 426 and 428, respectively, and the size of the transistor 430 may be adjusted to set a specific delay for the RC delay circuit 400. Thus, the RC delay circuit may be designed to exhibit a specific delay characteristic, such as constant RC delay, some PTAT characteristic RC delay, or some CTAT characteristic delay.

In operation, the RC delay circuit 400 may be implemented in timing-based operations or applications to provide a specific, temperature-independent RC delay. That is, in response to the A signal, the RC delay circuit 400 may provide the Dout signal having the specific RC delay. The delay through the RC delay circuit 400 may be primarily based on the R1 and R2 resistance values, the gm of the transistor 430, and the C of the capacitor 440. In some examples, the R1 and R2 resistance values and the gm values for RC delay circuit 400 may be designed to provide a temperature-independent RC delay, where temperature-based differences of the PTAT characteristic circuitry (e.g., the resistors 426 and 428) are counter-balanced by temperature-based differences of the CTAT characteristic circuitry (e.g., the transistor 430).

The inverter 420 inverts the output of the inverter 410 at the node 473. The inverter 450 inverts the output of the node 473 to provide and the inverter 460 inverts the output of the inverter 450 to provide the Dout signal. The inverter 410 and the inverter 460 may be driver circuits, where the inverter 410 is configured to drive the inverter 420 and transistor 430 and the inverter 460 is configured to drive the Dout signal to downstream circuitry. The inverter 450 may be a fast, low latency inverter to provide an even number of signal inverters such that the A signal matches the Dout signal after the delay with only a small impact on a total delay of the RC delay circuit 400.

The transistor 430 may be a p-type transistor. In some examples, additional inverters similar to the inverter 420 may be added in series to provide a longer RC delay without departing from the scope of the disclosure. Implementing the transistor 430 in parallel with the resistors 426 and 428, respectively, may reduce temperature-based RC delay differences as compared with designs that only include the resistors 426 and 428.

Figure 5:
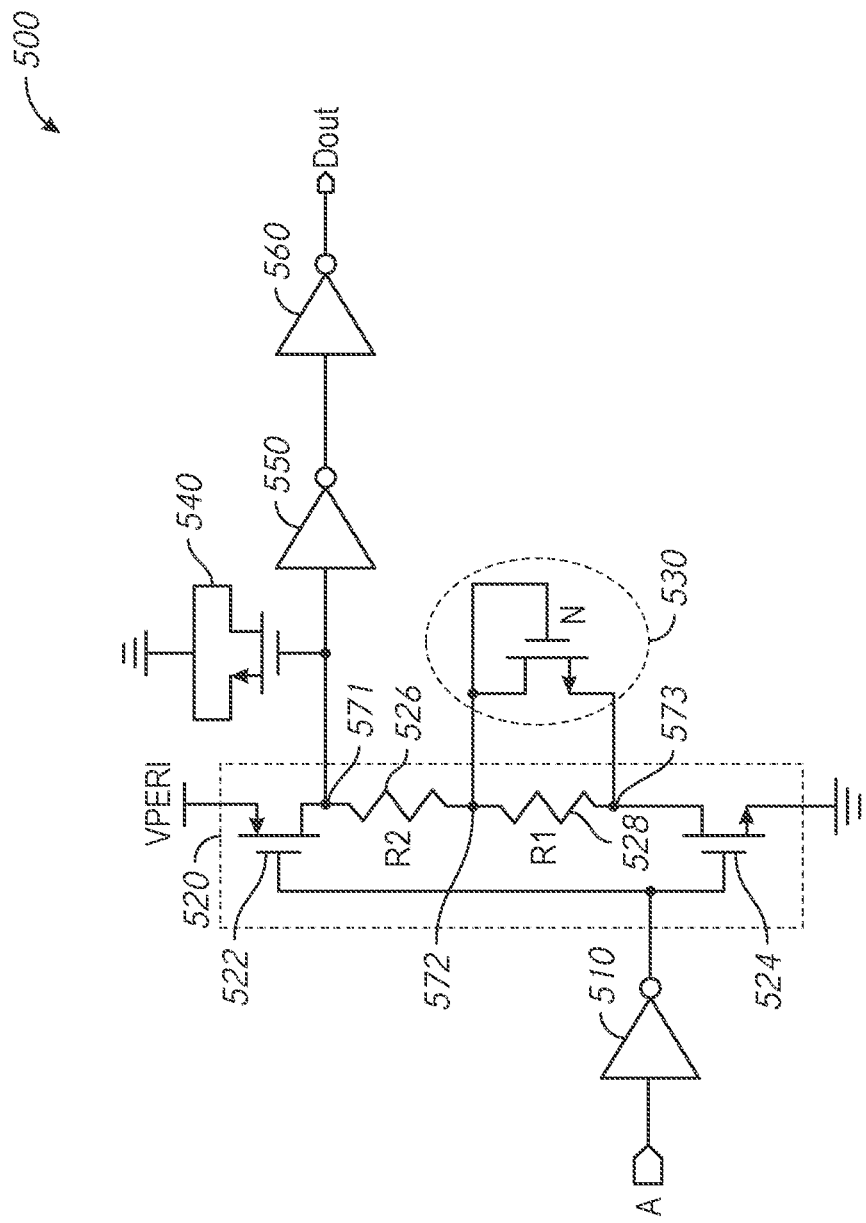
FIG. 5 is a circuit diagram of an RC delay circuit in accordance with an embodiment of the present disclosure.

FIG. 5 is a circuit diagram of an RC delay circuit 500 in accordance with an embodiment of the present disclosure. Circuitry of the RAS timing chain the semiconductor device 100 of FIG. 1 (e.g., the command decoder, the address decoder, the row decoders, memory array circuitry 145, or any combination thereof) may implement the RC delay circuit 500. The RC delay circuit 500 may include an inverter 510 coupled to an inverter 520, which may be coupled to a transistor 530, a capacitor 540, an inverter 550 and an inverter 560. The RC delay circuit 500 may receive an input signal A and provide an output signal Dout The inverter 510 may provide an inverter A signal to the inverter 520. The inverter 520 may include a pair of serially coupled transistors 522 and 524. The gates of the transistors 522 and 524 may each be coupled to the output of the inverter 510. The inverter 520 may further include a pair of serially-coupled resistors 526 (e.g., third circuitry or third circuit component) and 528 (e.g., first circuitry or first circuit component) coupled between nodes 571 and 573 and having resistances R2 and R1, respectively. The transistor 530 (e.g., second circuitry or second circuit component) may be coupled in parallel with the resistor 528 between the nodes 572 and 573, with a gate of the transistor 530 coupled to the node 572. A capacitor 540 having a capacitance C is coupled to the node 571. Relative sizes of the resistors 526 and 528 may be selected to provide a particular RC delay. In some examples, impedance of the resistors 526 and 528 may exhibit PTAT characteristics (e.g., the RC delay is shorter at lower temperatures and longer at higher temperature). To counteract the PTAT behavior, the transistor 530 may be coupled in parallel with the resistor 528. The impedance of the transistor 530 may be 1/gm, where gm is the conductance of the transistor 530. Thus, the impedance of the transistor 530 has CTAT characteristics. The size of the transistor 530 may be adjusted to adjust the gm value.

The total delay for the RC delay circuit may be defined as:

$$Tdelay=(1/gm\|R1+R2)*C$$

The R2 and R1 values of the resistors 526 and 528, respectively, and the size of the transistor 530 may be adjusted to set a specific delay for the RC delay circuit 500. Thus, the RC delay circuit may be designed to exhibit a specific delay characteristic, such as constant RC delay, some PTAT characteristic RC delay, or some CTAT characteristic delay.

In operation, the RC delay circuit 500 may be implemented in timing-based operations or applications to provide a specific, temperature-independent RC delay. That is, in response to the A signal, the RC delay circuit 500 may provide the Dout signal having the specific RC delay. The delay through the RC delay circuit 500 may be primarily based on the R1 and R2 resistance values, the gm of the transistor 530, and the C of the capacitor 540. In some examples, the R1 and R2 resistance values and the gm values for RC delay circuit 500 may be designed to provide a temperature-independent RC delay, where temperature-based differences of the PTAT characteristic circuitry (e.g., the resistors 526 and 528) are counter-balanced by temperature-based differences of the CTAT characteristic circuitry (e.g., the transistor 530).

The inverter 520 inverts the output of the inverter 510 at the node 571. The inverter 550 inverts the output of the node 571 to provide and the inverter 560 inverts the output of the inverter 550 to provide the Dout signal. The inverter 510 and the inverter 560 may be driver circuits, where the inverter 510 is configured to drive the inverter 520 and transistor 530 and the inverter 560 is configured to drive the Dout signal to downstream circuitry. The inverter 550 may be a fast, low latency inverter to provide an even number of signal inverters such that the A signal matches the Dout signal after the delay with only a small impact on a total delay of the RC delay circuit 500.

The transistor 530 may be an n-type transistor. In some examples, additional inverters similar to the inverter 420 may be added in series to provide a longer RC delay without departing from the scope of the disclosure. Implementing the transistor 530 in parallel with the resistors 526 and 528, respectively, may reduce temperature-based RC delay differences as compared with designs that only include the resistors 526 and 528. Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
an oscillator circuit configured to provide an oscillator signal having a delay based on included first circuitry and second circuitry of the oscillator circuit, the included first circuitry and second circuitry each having impedance that is proportional to absolute temperature (PTAT), and based on included third circuitry having impedance that is complementary to absolute temperature (CTAT).

2. The apparatus of claim 1, wherein the first circuitry comprises a first resistor, the second circuitry comprises a second resistor, and the third circuitry comprises a transistor.

3. The apparatus of claim 2, wherein the first circuitry is coupled to a first node and a second node, and wherein the third circuitry is coupled to the first node and the second node.

4. The apparatus of claim 1, further comprising:
a first delay element comprising the first circuitry, the second circuitry, and the third circuitry, wherein the delay is based at least in part on a conductance of the third circuitry, a resistance of the first circuitry, a resistance of the second circuitry, and a capacitance of a capacitor.

5. The apparatus of claim 4, wherein the capacitor is coupled to the second circuitry.

6. The apparatus of claim 4, further comprising:
a second delay element coupled to the first delay element.

7. The apparatus of claim 6, wherein the second delay element comprises a fourth circuitry corresponding to the first circuitry, a fifth circuitry corresponding to the second circuitry, and a sixth circuitry corresponding to the third circuitry.

8. The apparatus of claim 6, wherein the first delay element and the second delay element have equal delays.

9. 9An apparatus comprising:
a memory comprising timing circuitry comprising a first circuit component having impedance that is proportional to absolute temperature (PTAT) and a second circuit component having impedance that is complementary to absolute temperature (CTAT), wherein the timing chain circuitry is a row address strobe (RAS) timing chain circuitry, the RAS timing chain circuitry comprising a command decoder circuit, an address decoder circuit, a row decoder circuit, memory array circuitry, or any combination thereof.

10. An apparatus comprising:
a memory comprising timing circuitry comprising a first circuit component having impedance that is proportional to absolute temperature (PTAT) and a second circuit component having impedance that is complementary to absolute temperature (CTAT), wherein the first circuit component is a different type of circuit component than the second circuit component.

11. The apparatus of claim 10, wherein the second circuit component comprises a p-type transistor.

12. The apparatus of claim 10, wherein the second circuit component comprises an n-type transistor.

13. An apparatus comprising:
a memory comprising timing circuitry comprising a first circuit component having impedance that is proportional to absolute temperature (PTAT) and a second circuit component having impedance that is complementary to absolute temperature (CTAT), and
a third circuit component having impedance that is proportional to absolute temperature (PTAT), wherein the first circuit component, the second circuit component, and the third circuit component share a common node.

14. A delay circuit comprising:
a first circuit component coupled to a first transistor and an output node, and having impedance that is proportional to absolute temperature (PTAT); and
a second circuit component coupled to the first transistor and the output node, and further coupled in parallel with at least a first element of the first circuit component, wherein the second circuit component has an impedance that is complementary to absolute temperature (CTAT), and wherein the first circuit component is configured to provide an output signal at the output node.

15. The delay circuit of claim 14, further comprising:
a first inverter configured to provide an output signal at the output node responsive to an input signal.

16. The delay circuit of claim 14, wherein the first circuit component comprises two resistors, the second circuit component comprises a second transistor, and the first element of the first circuit component comprises a first resistor of the two resistors.

17. The delay circuit of claim 14, further comprising:
a third transistor coupled to the output node and the first circuit component.

18. The delay circuit of claim 17, wherein the first transistor and the third transistor are coupled to each other and are coupled to a second inverter, the second inverter configured to provide a signal to the first transistor and the third transistor.

19. The delay circuit of claim 17, wherein the first transistor is further coupled to an internal voltage, and wherein the third transistor is further coupled to a ground node.

* * * * *

UNITED STATES PATENT AND TRADEMARK OFFICE
CERTIFICATE OF CORRECTION

| | |
|---|---|
| PATENT NO. | : 11,929,749 B2 |
| APPLICATION NO. | : 17/813291 |
| DATED | : March 12, 2024 |
| INVENTOR(S) | : Zhiqi Huang, Weilu Chu and Dong Pan |

Page 1 of 1

It is certified that error appears in the above-identified patent and that said Letters Patent is hereby corrected as shown below:

In the Claims

| | Claim | Reads | Should Read |
|---|---|---|---|
| Column 11, Line 6 | 9 | "9. 9An apparatus comprising:" | -- 9. An apparatus comprising: -- |
| Column 11, Line 10 | 9 | "wherein the timing chain circuitry" | -- wherein the timing circuitry -- |

Signed and Sealed this
Fourth Day of June, 2024

*Katherine Kelly Vidal*

Katherine Kelly Vidal
*Director of the United States Patent and Trademark Office*